US010319602B2

(12) United States Patent
Kobayashi et al.

(10) Patent No.: US 10,319,602 B2
(45) Date of Patent: Jun. 11, 2019

(54) SUBSTRATE TREATMENT METHOD AND SUBSTRATE TREATMENT APPARATUS (71) Applicant: SHIBAURA MECHATRONICS CORPORATION, Yokohama-shi (JP)

(72) Inventors: Nobuo Kobayashi, Yokohama (JP); Koichi Hamada, Yokohama (JP); Yoshiaki Kurokawa, Yokohama (JP); Masaaki Furuya, Yokohama (JP); Hideki Mori, Yokohama (JP); Yasushi Watanabe, Yokohama (JP); Yoshinori Hayashi, Yokohama (JP)

(73) Assignee: SHIBAURA MECHATRONICS CORPORATION, Yokohama-shi (JP)

( * ) Notice: Subject to any disclaimer, the term of this patent is extended or adjusted under 35 U.S.C. 154(b) by 0 days.

(21) Appl. No.: 14/490,939

(22) Filed: Sep. 19, 2014

(65) Prior Publication Data
US 2015/0093906 A1 Apr. 2, 2015

(30) Foreign Application Priority Data

Sep. 30, 2013 (JP) ................. 2013-205624
Dec. 16, 2013 (JP) ................. 2013-259658
Aug. 25, 2014 (JP) ................. 2014-170205

(51) Int. Cl.
H01L 21/311 (2006.01)
B05C 3/02 (2006.01)
H01L 21/67 (2006.01)

(52) U.S. Cl.
CPC .... H01L 21/31111 (2013.01); H01L 21/6708 (2013.01); H01L 21/67017 (2013.01)

(58) Field of Classification Search
USPC ...................... 156/345.18, 345.55
See application file for complete search history.

(56) References Cited

U.S. PATENT DOCUMENTS 6,086,711 A * 7/2000 Kanishak ............ C23C 16/4405
118/726
6,780,277 B2 * 8/2004 Yokomizo ......... H01L 21/67086
156/345.11
(Continued)

FOREIGN PATENT DOCUMENTS

JP H04-288831 A 10/1992
JP 2005-079212 A 3/2005
JP 4424517 B2 3/2010

OTHER PUBLICATIONS

Machine Generated English Translation of JP4424517. Published Mar. 3, 2010.*

Primary Examiner — Sylvia MacArthur
(74) Attorney, Agent, or Firm — Kratz, Quintos & Hanson, LLP (57) ABSTRACT A substrate treatment apparatus which can more efficiently regenerate phosphoric acid which is able to be returned to etching treatment along with such etching treatment as much as possible without using a large facility, that is, a substrate treatment apparatus which treats a silicon substrate W on which a nitride film is formed by a liquid etchant which contains phosphoric acid, which comprises an etching treatment unit (the spin treatment unit 30) which gives a suitable quantity of liquid etchant to each substrate which is fed one at a time so as to etch the substrate and remove the nitride film, a phosphoric acid regenerating unit (the spin treatment unit 30) which mixes liquid etchant used for treatment of one substrate and a suitable quantity of liquid hydrofluoric acid for the amount of the used liquid etchant under a predetermined temperature environment to regenerate the phosphoric acid, and a phosphoric acid recovery unit (the pump 38, phosphoric acid recovery tank 50, and pump 52) which returns the phosphoric acid which was obtained by the (Continued)

phosphoric acid regenerating unit to the liquid etchant to be used at the etching treatment unit.

6 Claims, 8 Drawing Sheets

(56) References Cited

U.S. PATENT DOCUMENTS

| | | | | |
|---|---|---|---|---|
| 6,878,303 | B2* | 4/2005 | Okamoto | H01L 21/67253 |
| | | | | 118/52 |
| 7,635,397 | B2* | 12/2009 | Okuchi | H01L 21/67086 |
| | | | | 29/25.01 |
| 2005/0067101 | A1 | 3/2005 | Funabashi | |
| 2008/0087645 | A1* | 4/2008 | Izuta | C09K 13/04 |
| | | | | 216/93 |
| 2011/0297192 | A1* | 12/2011 | Ogata | H01L 21/67051 |
| | | | | 134/94.1 |
| 2012/0074102 | A1* | 3/2012 | Magara | C11D 7/08 |
| | | | | 216/83 |
| 2015/0020968 | A1* | 1/2015 | Kimura | H01L 21/67086 |
| | | | | 156/345.18 |
| 2015/0093906 | A1* | 4/2015 | Kobayashi | H01L 21/31111 |
| | | | | 438/748 |

* cited by examiner

SUBSTRATE TREATMENT METHOD AND SUBSTRATE TREATMENT APPARATUS

TECHNICAL FIELD

The present invention relates to a substrate treatment method and apparatus which treat a silicon substrate on which a nitride film is formed using liquid etchant which contains phosphoric acid.

BACKGROUND ART

In the past, a substrate treatment method which uses liquid enchant which contains phosphoric acid ($H_3PO_4$) to etch a silicon semiconductor wafer (substrate) on which a nitride film ($Si_3N_4$) and oxide film ($SiO_2$) are formed has been proposed (see PLT 1). In this substrate treatment method, a plurality of semiconductor wafers are dipped into the liquid enchant which contains phosphoric acid ($H_3PO_4$) which is stored in an etching tank so that the plurality of semiconductor wafers sire etched all together. In this etching treatment, the phosphoric acid in the liquid etchant acts as a catalyst whereby the semiconductor wafers are stripped of their nitride films ($Si_3N_4$).

Further, the used liquid etchant which remains inside the etching treatment tank after the etching treatment is transferred through a receiving tank to a treatment tank of a regenerating system. Inside the treatment tank in which the used liquid etchant is stored, a suitable quantity of liquid hydrofluoric acid (HF) for the amount of the used liquid etchant is added. In the treatment tank, under a relatively high temperature predetermined temperature environment, the used liquid etchant which contains ingredients based on the nitrides which are removed by the etching treatment and liquid hydrofluoric acid (HF) are mixed and reacted whereby the phosphoric acid ($H_3PO_4$) is regenerated. This regenerated phosphoric acid ($H_3PO_4$) is returned to the liquid etchant to be used for the etching treatment.

According to such a substrate treatment method, since the phosphoric acid is regenerated from the used liquid etchant which remains after the etching treatment and that phosphoric acid is returned to the liquid etchant to be used for the etching treatment, it is possible to make effective use of the phosphoric acid while continuing to perform etching treatment on the semiconductor wafers for removing the nitride films.

CITATION LIST

Patent Literature

PLT 1: Japanese Patent No. 4424517

SUMMARY OF INVENTION

Technical Problem

However, in the above-mentioned substrate treatment method, a large etching tank is required for etching the large number of substrates in a batch. Further, a large enough amount of used liquid etchant to etch such a large number of substrates in a batch is stored in a treatment tank, liquid hydrofluoric acid is added to the treatment tank in a suitable quantity, and the used liquid etchant and liquid hydrofluoric acid are reacted under a relatively high temperature predetermined temperature environment, so the facilities for maintaining a large amount of used liquid etchant and a large amount of liquid hydrofluoric acid for that at a predetermined temperature environment become massive. Further, while the amount of phosphoric acid which is regenerated at one time is large, a relatively long time is required until the large amount of used liquid etchant as a whole and the liquid hydrofluoric acid as a whole are mixed enough to enable efficient reaction in the treatment tank and it cannot necessarily be said that phosphoric acid can be regenerated efficiently.

The present invention was made in consideration of this situation and provides a substrate treatment method and substrate treatment apparatus which can more efficiently regenerate phosphoric acid which is able to be returned to etching treatment along with such etching treatment as much as possible without using a large facility.

Solution to Problem

The substrate treatment method according to the present invention is a substrate treatment method which treats a silicon substrate on which a nitride film is formed using liquid etchant which contains phosphoric acid, the substrate treatment method comprising: an etching treatment step for giving a suitable quantity of liquid etchant to each substrate which is fed one at a time so as to etch the substrate and remove the nitride film; a phosphoric acid regenerating step for mixing the liquid etchant used for treatment of a predetermined number of substrates treated one at a time at the etching treatment step and a suitable quantity of liquid hydrofluoric acid for the amount of the liquid etchant used for treatment of the predetermined number of substrates under a predetermined temperature environment to regenerate phosphoric acid; and a phosphoric acid recovery step for returning the phosphoric acid which is obtained by the phosphoric acid regenerating step to the liquid etchant to be used at the etching treatment step.

Due to this configuration, there is no need for a large etching tank (facility) like the batch system; it is possible to etch one substrate at a time. By mixing of the liquid etchant used for etching treatment of the predetermined number (including one) of substrates treated one at a time and the suitable quantity of liquid hydrofluoric acid for the amount of used liquid etchant at a predetermined temperature environment and reaction of she used liquid etchant and liquid hydrofluoric acid, phosphoric acid to be returned to the liquid etchant is regenerated.

In a case where the predetermined number is one substrate, it is possible to regenerate the phosphoric by a facility which can mix the particularly small amount of liquid etchant used for etching the single substrate and the particularly small amount of liquid hydrofluoric acid of the suitable quantity for the amount of used liquid.

The substrate treatment method according to the present invention is a substrate treatment method which treats a silicon substrate on which a nitride film is formed using liquid etchant which contains phosphoric acid, the substrate treatment method comprising: an etching treatment step for dipping a plurality of substrates in the liquid etchant to etch each of said plurality of substrates and remove the nitride film, a phosphoric acid regenerating step for mixing both of the used liquid etchant remaining after etching treatment at the etching treatment step and hydrofluoric acid while being rendered an atomized state or vaporized state under a predetermined temperature environment to regenerate the phosphoric acid; and a phosphoric acid recovery step for returning the phosphoric acid which is obtained by the phosphoric acid regenerating step to the liquid etchant to be used at the etching treatment step.

Due to this configuration, even if using a large amount of liquid etchant for batch etching a plurality of substrates, since the used liquid etchant and the liquid hydrofluoric acid are mixed and react with each other in an atomized or vaporized state, it is possible to efficiently make the used liquid etchant and liquid hydrofluoric acid react and regenerate the phosphorus acid to be returned to the liquid etchant without using a facility for storing and reacting the entire amount of liquid etchant used after etching the plurality of substrates and the liquid hydrofluoric acid.

The substrate treatment apparatus according to the present invention is a substrate treatment apparatus which treats a silicon substrate on which a nitride film is formed using liquid etchant which contains phosphoric acid, the substrate treatment apparatus comprising: an etching treatment unit which gives a suitable quantity of liquid etchant to each substrate which is fed one at a time so as to etch the substrate and remove the nitride film; a phosphoric acid regenerating unit which mixes the liquid etchant used for treatment of a predetermined number of substrates treated one at a time at the etching treatment unit and a suitable quantity of liquid hydrofluoric acid for the amount of the liquid etchant used for treatment of the predetermined number of substrates under a predetermined temperature environment to regenerate the phosphoric acid; and a phosphoric acid recovery unit which returns the phosphoric acid which is obtained by the phosphoric acid regenerating unit to the liquid etchant to be used at the etching treatment unit.

Due to this configuration, there is no need for a large etching tank (facility) like a batch system: the etching treatment unit can etch one substrate at a time. Then, the phosphoric acid regenerating unit regenerate the phosphoric acid to be returned to the liquid etchant by mixing the liquid etchant used for etching treatment of the predetermined number (including one) of substrates treated one at a time and the suitable quantity of liquid hydrofluoric acid for the amount of used liquid etchant at a predetermined temperature environment and reaction of the used liquid etchant and liquid hydrofluoric acid.

The substrate treatment apparatus according to the present invention is a substrate treatment apparatus which treats a silicon substrate on which a nitride film is formed using liquid etchant which contains phosphoric acid, the substrate treatment apparatus comprising: an etching treatment unit which dips a plurality of substrates into the liquid etchant to etch each of said plurality of substrates and remove the nitride film; a phosphoric acid regenerating unit which mixes both of the used liquid etchant remaining after etching treatment at said etching treatment unit and hydrofluoric acid while being rendered an atomized state or vaporized state under a predetermined temperature environment to regenerate the phosphoric acid; and a phosphoric acid recovery unit which returns the phosphoric acid which is obtained by said phosphoric acid regenerating unit to the liquid etchant to be used at said etching treatment unit.

Due to this configuration, even if using a large amount of liquid etchant for batch etching a plurality of substrates at the etching treatment unit, the used liquid etchant and the liquid hydrofluoric acid are mixed in the atomized or vaporized state and react with each other at a predetermined temperature environment, so it is possible to make the used liquid etchant and liquid hydrofluoric acid efficiently react to regenerate the phosphoric acid without using a facility which stores and reacts the entire amount of liquid etchant used after etching treatment of the plurality of substrates and liquid hydrofluoric acid.

Advantageous Effects of the Invention

According to the substrate treatment method and substrate treatment apparatus according to the present invention, it is possible to more efficiently regenerate phosphoric acid which is able to be returned to etching treatment along with such etching treatment as much as possible without using a large facility.

DESCRIPTION OF EMBODIMENTS

Below, embodiments of the present invention will be explained using the drawings.

Figure 1:
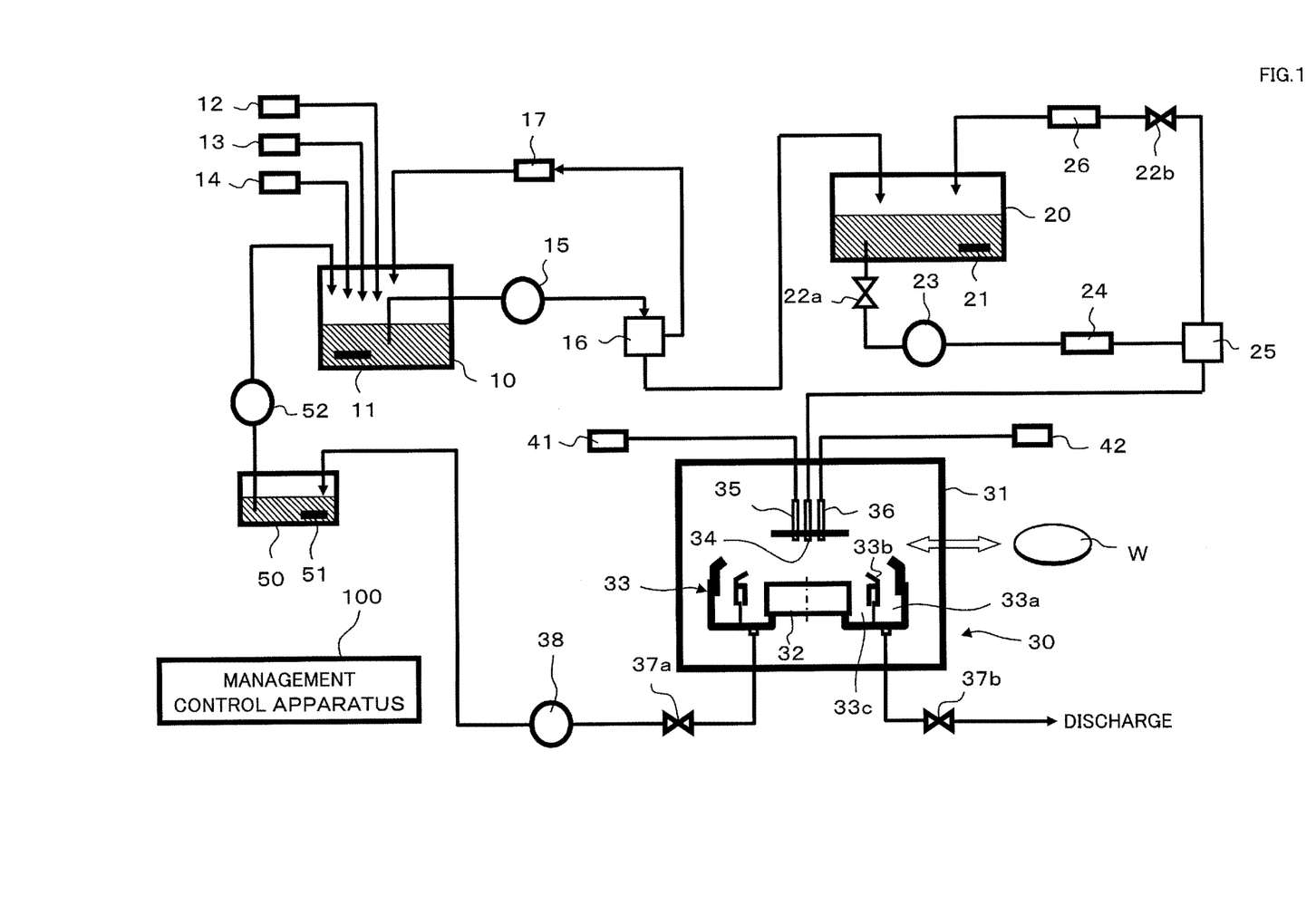
FIG. 1 is a view which shows the basic configuration of a substrate treatment apparatus according to a first embodiment of the present invention.

The substrate treatment apparatus according to a first embodiment of the present invention is comprised as shown in FIG. 1.

In FIG. 1, the substrate treatment apparatus has a liquid etchant producing tank 10, a liquid etchant storage tank 20, a spin treatment unit 30 (the etching treatment unit and the phosphoric acid regenerating unit), and a phosphoric acid recovery tank 50 (the phosphoric acid recovery unit). Further, the substrate treatment apparatus has a phosphoric acid feed unit 12, a water feed, unit 13, and a silica feed unit 14. The phosphoric acid feed unit 12 supplies a predetermined concentration of liquid phosphoric acid ($H_3PO_4$) to the liquid etchant producing tank 10, the water feed unit 13 feeds pure water ($H_2O$) to it, and the silica feed unit 14 feeds colloidal silica ($SiO_2$) to it. The liquid etchant producing tank 10 is provided with a heater unit 11. In the liquid etchant producing tank 10, the liquid phosphoric acid ($H_3PO_4$), pure water ($H_2O$), and colloidal silica ($SiO_2$) which are supplied from the phosphoric acid feed unit 12, the water feed unit 13, and the silica feed unit 14 in suitable quantities are mixed. They are maintained at a predetermined temperature by heating by the heater unit 11. Under the predetermined temperature environment, the liquid phosphoric acid ($H_3PO_4$), pure water ($H_2O$), and colloidal silica ($SiO_2$) are mixed whereupon liquid etchant which contains phosphoric acid and a silicon ingredient is produced.

Note that, by adding a suitable quantity of colloidal silica ($SiO_2$) from the silica feed unit 14 to the liquid etchant (liquid phosphoric acid) to adjust the silicon concentration in the liquid etchant, the selection ratio of the nitride film ($Si_3N_4$) and oxide film ($SiO_2$) which are formed on the semiconductor wafer which is etched is maintained in a predetermined range.

The liquid etchant producing tank 10 is provided with a circulation path. In the circulation path, a pump 15, a selector valve 16, and a concentration detector 17 are provided. This circulation path is further provided with a heater (not shown). Due to operation of the pump 15, the liquid etchant in the liquid etchant producing tank 10 is returned, in a state maintained at a predetermined temperature, through the selector valve 16 and concentration detector 17 to the liquid etchant producing tank 10. Due to such circulation of the liquid etchant, inside the liquid etchant producing tank 10, the liquid phosphoric acid ($H_3PO_4$), pure water ($H_2O$), and colloidal silica ($SiO_2$) are stirred and mixed. Further, the concentration detection information of the concentration detector 17 provided in the circulation path is used as the basis for the concentration of phosphoric acid in the liquid etchant which is produced to be monitored by a management control apparatus 100. The selector valve 16 switches between the circulation path and a path from the liquid etchant producing tank 10 to the liquid etchant storage tank 20. Due to operation of the pump 15 in the state switched by the selector valve 16 to the path at the liquid etchant storage tank 20 side, the liquid etchant produced at the liquid etchant producing tank 10 is supplied to and stored at the liquid etchant storage tank 20.

The liquid etchant storage tank 20 is provided with a heater unit 21. In the liquid etchant storage tank 20, the liquid etchant which is supplied from the liquid etchant producing tank 10 and stored is maintained at a predetermined temperature. The liquid etchant storage tank 20 is provided with a circulation path. In this circulation path, an on-off valve 22a, a pump 23, a flowmeter 24, a selector valve 25, an on-off valve 22b, and a cooler 26 are provided. Further, while not shown, the part of the circulation path between the pump 23 and the selector valve 25 is provided with a heater. In the state with the on-off valves 22a and 22b opened, the liquid etchant which is stored at the liquid etchant storage tank 20 while being maintained at a predetermined temperature is returned by operation of the pump 23 through the circulation path (the flowmeter 24, the selector valve 25, and the cooler 26) to the liquid etchant storage tank 20. Due to such circulation of the liquid etchant, the liquid etchant which is stored in the liquid etchant storage tank 20 is adjusted in temperature and concentration to predetermined conditions. The selector valve 25 switches between the circulation path and a path from the liquid etchant storage tank 20 to the spin treatment unit 30. Due to operation of the pump 23 in the state switched to the path at the spin treatment unit 30 side by the selector valve 25, the liquid etchant which is stored at the liquid etchant storage tank 20 is supplied to the spin treatment unit 30.

The spin treatment unit 30 (the etching treatment unit and the phosphoric acid regenerating unit) has a treatment chamber 31. Inside the treatment chamber 31, a substrate spin mechanism 32 which makes a semiconductor wafer W spin is provided. A liquid etchant ejection nozzle 34 (the liquid etchant feed mechanism), a liquid rinse ejection nozzle 35, and a hydrofluoric acid ejection, nozzle 36 are provided which are arranged so as to face the substrate spin mechanism 32. Further, inside of the treatment chamber 31, a separate cup mechanism 33 (the liquid storing part) is provided so as to be arranged around the substrate spin mechanism 32. The separate cup mechanism 33 has an inside liquid storing cup 33c and an outside liquid storing cup 33a which is arranged at the outside. At the boundary part of the inside liquid storing cup 33c and the outside liquid storing cup 33a, a separator 33b is provided. The separator 33b ascends and descends in a predetermined range by an actuator (not shown). At the liquid etchant ejection nozzle 34, a path which extends from the above-mentioned liquid etchant storage tank 20 through the selector valve 25 to the spin treatment unit 30 side is connected. Further, the substrate treatment apparatus has a liquid rinse feed unit 41 and a hydrofluoric acid feed unit 42. From the liquid rinse feed unit 41, a liquid rinse (for example, pure water) is fed to the liquid rinse ejection nozzle 35. From the hydrofluoric acid feed unit 42, the liquid hydrofluoric acid (HF) of predetermined concentration is fed to the hydrofluoric acid ejection nozzle 36 (the hydrofluoric acid, feed mechanism).

The path which extends from the inside liquid storing cup 33c runs through an on-off valve 37a and pump 38 to reach the phosphoric acid recovery tank 50. Further, the path which extends from the outside liquid storing cup 33a runs through an on-off valve 37b to reach a liquid waste tank (not shown).

Due to the later explained treatment for regenerating the phosphoric acid, the liquid phosphoric acid ($H_3PO_4$) which is stored at the inside liquid storing cup 33c of the spin treatment unit 30 (the phosphoric acid regenerating unit) is supplied by operation of the pump 38 through the on-off valve 37a to the phosphoric acid recovery tank 50. The phosphoric acid recovery tank 50 is provided with a heater unit 51 by which the liquid phosphoric acid stored at the phosphoric acid recovery tank 50 is maintained at a predetermined temperature. A path extends from the phosphoric acid recovery tank 50 to the liquid etchant producing tank 10 through a pump 52, Due to operation of the pump 52, the liquid phosphoric acid runs from the phosphoric acid recovery tank 50 through the path to be returned to the liquid etchant producing tank 10.

Note that, management of the temperature, flow rate, concentration, and other conditions of the liquid etchant explained above and the operations of the pumps, valves, selector valves, and heaters, operation of the spin treatment unit 30, and operation of the mechanisms for supply and discharge of a semiconductor wafer W to and from the spin treatment unit 30, and operations of other parts are controlled by a management control apparatus 100.

In the above-mentioned substrate treatment apparatus, a semiconductor wafer W is created in the following way under the management and control at the management control apparatus 100.

The liquid etchant which is produced in the liquid etchant producing tank 10 by mixing the liquid phosphoric acid ($H_3PO_4$), pure water ($H_2O$), and colloidal silica ($SiO_2$) is adjusted to a high temperature (for example, 160° C. or so) while being moved to the liquid etchant storage tank 20 at a predetermined timing. Due to this, the liquid etchant storage tank 20 is in a state with a liquid etchant stored in it at all times. The liquid etchant which is stored at the liquid etchant storage tank 20 is adjusted to a high temperature (for example, 160° C. or so). The liquid etchant which has been adjusted to a high temperature is supplied to the spin treatment unit 30.

Figure 2:
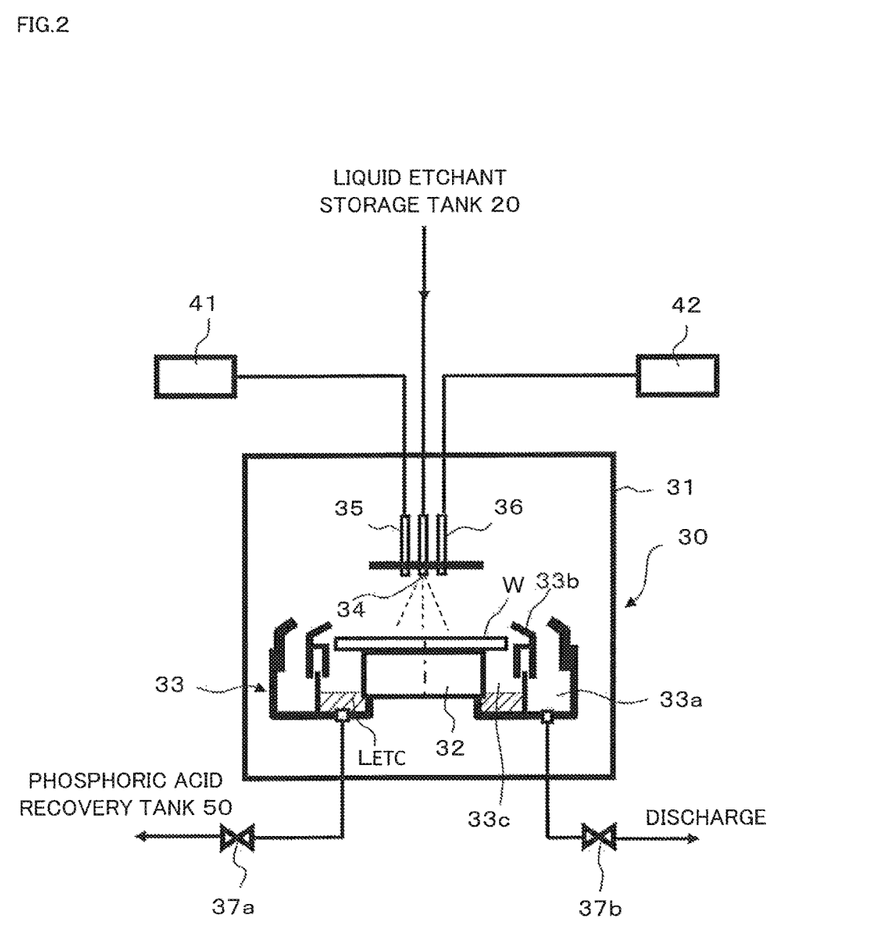
FIG. 2 is view which shows a spin treatment unit (etching treatment unit) in a state etching a semiconductor wafer in the substrate treatment apparatus which is shown in FIG. 1.

In the spin treatment unit 30 (the treatment chamber 31), one semiconductor wafer W at a time is supplied. The supplied semiconductor wafer W is etched. Specifically, as shown in FIG. 2, the supplied semiconductor wafer W is set at the substrate spin mechanism 32. Due to the substrate spin mechanism 32, the semiconductor wafer W is spun. In the state where the semiconductor wafer W is spinning, the liquid etchant which is supplied from the liquid etchant storage tank 20 and adjusted to a high temperature (for example, 160° C. or so) is ejected from the liquid etchant ejection nozzle 34. The liquid etchant which is ejected from the liquid etchant ejection nozzle 34 is given to the surface of the spinning semiconductor wafer W whereby the semiconductor wafer W is etched.

In this etching treatment, high temperature liquid etchant (containing phosphoric acid $H_3PO_4$, colloidal silica $SiO_2$, and $H_2O$) acts on the semiconductor wafer W whereupon water vapor ($H_2O$) and the nitride film ($Si_3N_4$) react in the presence of the liquid phosphoric acid, the nitride film ($Si_3N_4$) is removed, and ammonium phosphate ($[N_4^{30}]_3$ $[PO_4^{3-}]$) and silicic acid ($H_2SiO_3$) precipitate. Further, the liquid etchant which is used for the etching treatment, that is, the used liquid etchant LETC (including ammonium phosphate ($[NH_4^+]_3[PO_4^{3-}]$) and silicic acid ($H_2SiO_3$)), splatters due to spinning of the semiconductor wafer W. The splattered liquid etchant LETC is guided by the separator 33b adjusted to the ascended position to the inside liquid storing cup 33c where it is stored.

Figure 3:
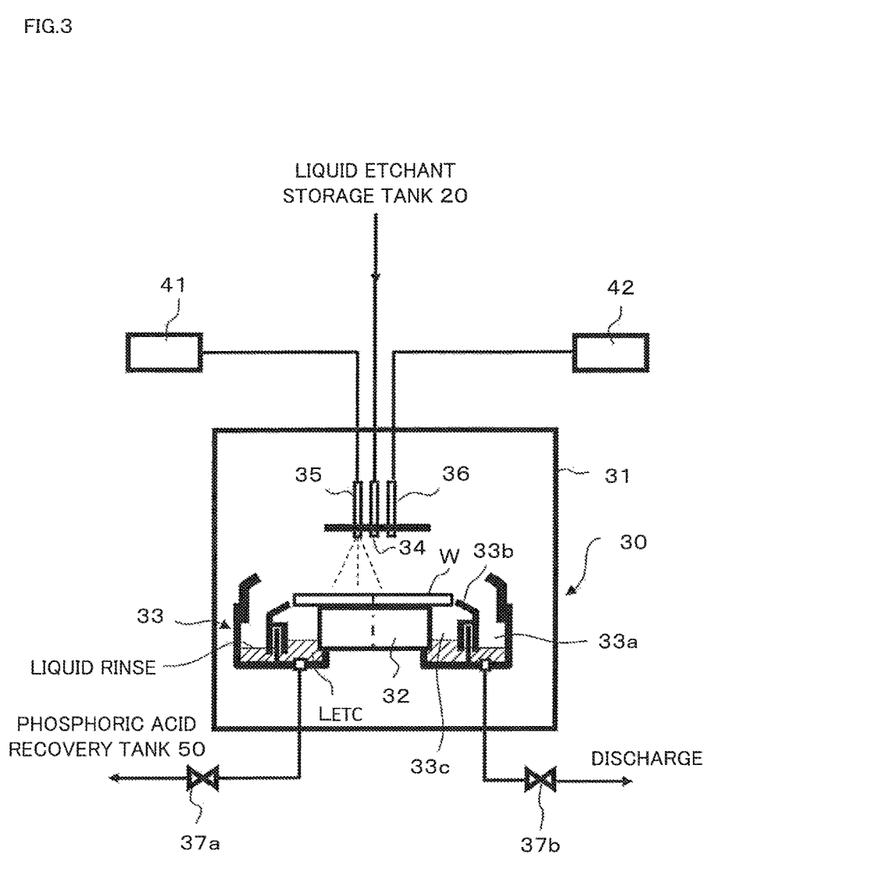
FIG. 3 is a view which shows a spin treatment unit in a state rinsing the semiconductor wafer after the etching treatment in the substrate treatment apparatus which is shown in FIG. 1.

When the etching of a single semiconductor wafer is completed in this way, the ejection of the liquid etchant from the liquid etchant ejection nozzle 34 is stopped and, as shown in FIG. 3, in the state with the separator 33b adjusted to the descended position, and the liquid rinse fed from the liquid rinse feed unit 41 (for example, pure water) is ejected from the liquid rinse ejection nozzle 35. The liquid rinse which, is ejected, from the liquid rinse ejection nozzle 35 is used to clean the surface of the spinning semiconductor wafer W. The liquid rinse which splatters after washing the semiconductor wafer w which spins at a high speed due to the substrate spin mechanism 32 passes the inside liquid storing cup 33c and is recollected at the outside liquid storing cup 33a separated from the used liquid etchant LETC which has been already stored at the inside liquid storing cup 33c.

When the rinse treatment of the semiconductor wafer W finishes, the liquid rinse stops being ejected from the liquid rinse ejection nozzle 35. The semiconductor wafer W passes through a drying and other processes and is discharged from the treatment chamber 31. Further, inside of the treatment chamber 31, the used liquid etchant LETC for treatment of one semiconductor wafer W is stored at the inside liquid storing cup 33c.

Figure 4:
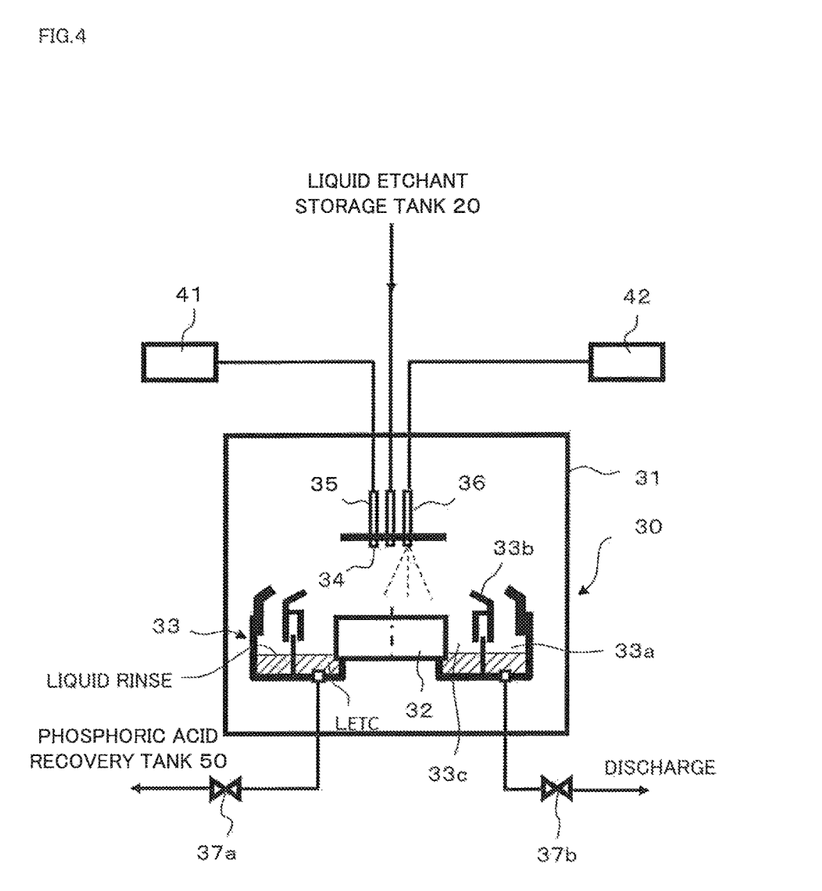
FIG. 4 is a view which shows a spin treatment unit (phosphoric acid regenerating unit) which discharges the semiconductor wafer and performs treatment to regenerate the phosphoric acid from the used liquid etchant in the substrate treatment apparatus which is shown in FIG. 1.

After that, as shown in FIG. 4, a suitable quantity of liquid hydrofluoric acid (HF) for the amount of used liquid etchant LETC for treatment of one semiconductor wafer which is stored in the inside liquid storing cup 33c is supplied from the hydrofluoric acid feed unit 42 and ejected from the hydrofluoric acid ejection nozzle 36. The amount of liquid hydrofluoric acid (HF) which is supplied to the used liquid etchant LETC for treatment of one semiconductor wafer is determined in advance by experiments etc. The liquid hydrofluoric acid (HF) ejected from the hydrofluoric acid ejection nozzle 36 is given to the inside liquid storing cup 33c, in which the high temperature (for example, 160° C. or so) used liquid etchant LETC is stored and which is in a high temperature environment, in an atomized state or partially or completely vaporized by that high temperature environment. At the inside liquid storing cup 33c, the used liquid etchant LETC (including ammonium phosphate ($[NH_4^+]_3[PO_4^{3-}]$) and silicic acid ($H_2SiO_3$)) and the liquid hydrofluoric acid (HF) are mixed and react under a predetermined high temperature environment whereupon the fluoride ingredient vaporizes (becomes a gas and is dispersed) whereby the phosphoric acid ($H_3PO_4$) is regenerated as a liquid.

The liquid phosphoric acid ($H_3PO_4$) which is regenerated at the inside liquid storing cup 33c of the spin treatment unit 30 (treatment chamber 31) as explained above is supplied to the phosphoric acid recovery tank 50 by operation of the pump 38 (see FIG. 1) in the state with the on-off valve 37a opened. The regenerating treatment of the liquid phosphoric acid ($H_3PO_4$) explained, above and the transfer of that liquid phosphoric acid, from the spin treatment unit 30 (the inside liquid storing cup 33c) to the phosphoric acid recovery tank 50 are performed each time one semiconductor wafer W finishes being etched. Further, the liquid phosphoric acid ($H_3PO_4$) which is successively stored at the phosphoric acid recovery tank 50 is adjusted by the heater unit 51 to a predetermined temperature while is returned to the liquid etchant producing tank 10 by operation of the pump 52 at a predetermined timing.

According to the above-mentioned substrate treatment apparatus, a large etching tank such as with the batch system is not necessary. The spin treatment unit 30 enables one semiconductor wafer W at a time to be etched. Further, after the semiconductor wafer W finishes being etched at the spin treatment unit 30, the liquid etchant LETC used for treatment of one semiconductor wafer which is stored at the inside liquid storing cup 33c is given a suitable quantity of liquid hydrofluoric acid for that amount of used liquid etchant LETC, so there is no need to use a separate large facility. It is possible to use the spin treatment unit 30 to make the liquid etchant LETC used for treatment of one semiconductor wafer and a suitable quantity of liquid hydrofluoric acid efficiently react to regenerate phosphoric acid ($H_3PO_4$). In particular, the used liquid etchant LETC which is originally adjusted to a high temperature (for example, 160° C. or so) is in a high temperature state even at the inside liquid storing cup 33c, so by giving the liquid hydrofluoric acid in an atomized state or vaporized state, the reactivity of the used liquid etchant LETC and liquid hydrofluoric acid becomes higher. Further, due to the high temperature environment inside the inside liquid storing cup 33c in which the used liquid etchant LETC is stored in the high temperature state, the reacted fluoride ingredient (for example, $H_2SiF_6$) or ammonia ingredient ($NH_3$) immediately easily vaporizes so the phosphoric acid can be more efficiently regenerated.

Note that, in the substrate treatment apparatus according to the above first embodiment (see FIG. 2 to FIG. 4), the liquid etchant LETC used for treatment of one semiconductor wafer which is stored at the inside liquid storing cup 33c of the span treatment unit 30 is given a suitable quantity of liquid hydrofluoric acid for that amount of used liquid etchant LETC, but the present invention is not limited to this. For example, the used liquid etchant LETC which is stored in the process of a predetermined number of two or more semiconductor wafers W being successively etched in the spin treatment unit 30 may be given a suitable quantity of liquid hydrofluoric acid for that amount of used liquid etchant LETC which is required for etching that predetermined number of semiconductor wafers W. Note that, the predetermined number is determined in a range whereby the total amount of the liquid etchant LETC used for etching the predetermined number of semiconductor wafers W and the suitable quantity of liquid hydrofluoric acid LHF for that amount of used liquid etchant LETC mixed together does not exceed the volume of the inside liquid storing cup 33c.

In this way, when mixing into the liquid etchant LETC used for treatment of a predetermined number of semiconductor wafers W treated one at a time a suitable quantity of liquid hydrofluoric acid for the amount of used liquid etchant LETC, the used liquid etchant LETC is successively stored in the inside liquid storing cup 33c of the spin treatment unit 30 until the predetermined number of semiconductor wafers W finish being etched. For this reason, it is preferable to provide a heater at the inside liquid storing cup 33c from the viewpoint of preventing the temperature of the used liquid etchant LETC of the inside liquid storing cup 33c from ending up falling until adding the liquid hydrofluoric acid.

Figure 5:
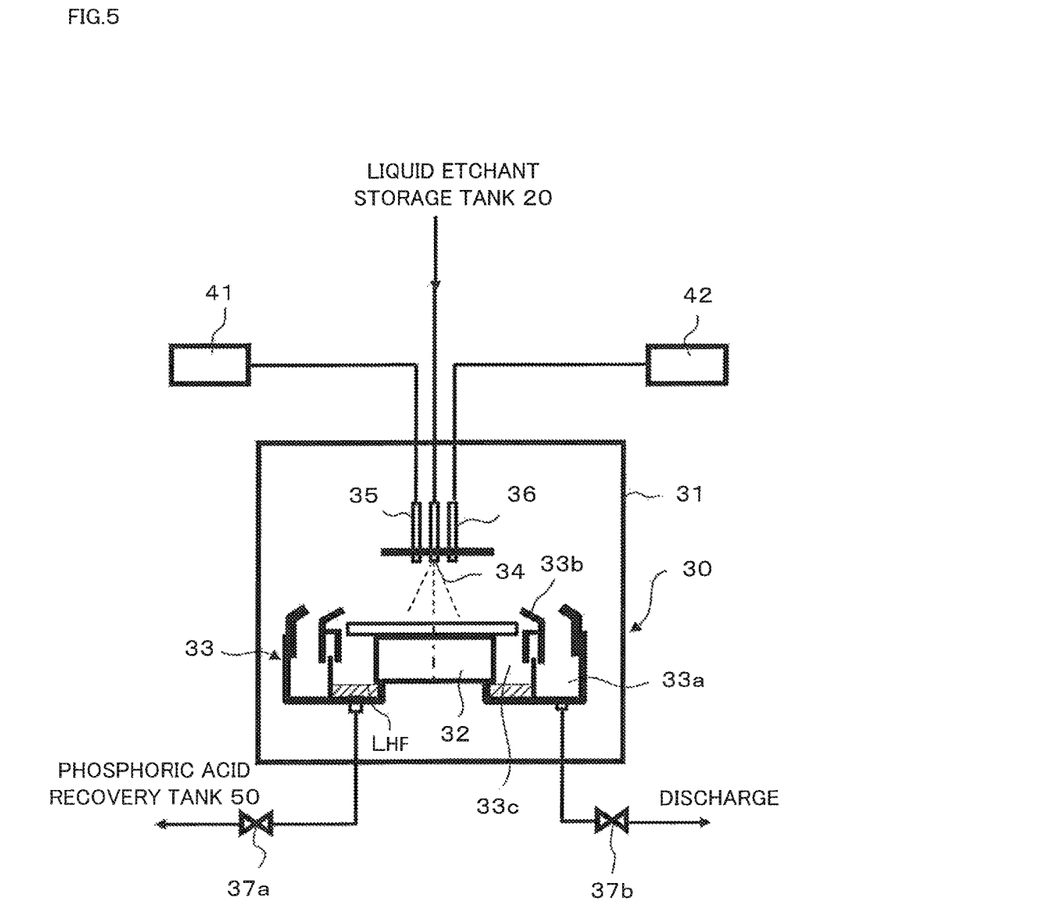
FIG. 5 is a view which shows a spin treatment unit (etching treatment unit and phosphoric acid regenerating unit) in a state regenerating the phosphoric acid from the used liquid etchant together with the etching treatment of the semiconductor wafer in the substrate treatment apparatus which is shown in FIG. 1.

In the above-mentioned substrate treatment apparatus, for example, as shown in FIG. 5, the spin treatment unit 30 can also regenerate the liquid phosphoric acid ($H_3PO_4$) (a modification of first embodiment).

In the state with the separator 33b adjusted to the ascended position in the spin treatment unit 30, the inside liquid storing cup 33c stores in advance the suitable quantity of liquid hydrofluoric acid LHF (HF) for the amount of the liquid etchant used for treatment of one semiconductor wafer W. In this state, in the spin treatment unit 30, the semiconductor wafer W which is spun by the substrate spin mechanism 32 is sprayed with the liquid etchant which is supplied from the liquid etchant storage tank 20 and adjusted to a high temperature (for example, 160° C. or so) from the liquid etchant ejection nozzle 34 so as to etch the semiconductor wafer W. In the process, the used liquid etchant which splatters from the surface of the rotating semiconductor wafer W enters the inside liquid storing cup 33c in which the liquid hydrofluoric acid LHF (HF) has been already stored. In the inside liquid storing cup 33c, the used liquid etchant LETC and the liquid hydrofluoric acid LHF mix and react in the same way as explained above whereby the phosphoric acid ($H_3PO_4$) is regenerated.

In this way, inside the inside liquid storing cup 33c of the spin treatment unit 30, a small amount of used liquid etchant (liquid etchant used for treatment of single substrate) and a small amount of hydrofluoric acid react, so it is possible to utilize the spin treatment unit 30 to make the liquid etchant used for treatment of a single substrate and a suitable quantity of liquid hydrofluoric acid LHF efficiently react to regenerate the phosphoric acid ($H_3PO_4$) without using a separate large facility. In particular, high temperature used liquid etchant is given to the liquid hydrofluoric acid LHF which is stored in the inside liquid storing cup 33c, so the reactivity of the used liquid etchant LETC and liquid hydrofluoric acid is high, the fluoride ingredient or ammonia ingredient immediately easily vaporizes due to the high temperature environment which is created by the ejection of the used liquid etchant LETC in the high temperature, and further phosphoric acid can be efficiently regenerated.

Note that, in the substrate treatment apparatus (see FIG. 5) according to the above-mentioned modification, the inside liquid storing cup 33c of the spin treatment unit 30 stores in advance a suitable quantity of liquid hydrofluoric acid LHF for the amount of liquid etchant LETC used for treatment of a single substrate W, but the present invention is not limited to this. For example, the inside liquid storing cup 33c of the spin treatment unit 30 stores in advance a suitable quantity of liquid hydrofluoric acid LHF for the amount of liquid etchant LETC used for treatment of a predetermined number of two or more semiconductor wafers W. Until, the predetermined number of semiconductor wafers W finishes being treated, the used liquid etchant LETC can be given to the liquid hydrofluoric acid LHF which is stored in the inside liquid storing cup 33 each time one semiconductor wafer W is treated. This predetermined number is determined in a range so that the total amount of the suitable quantity of liquid hydrofluoric acid LHF for the amount of liquid etchant LETC used for treatment of the predetermined number of semiconductor wafers W and the used liquid etchant LETC mixed together does not exceed the volume of the inside liquid storing cup 33c.

Figure 6:
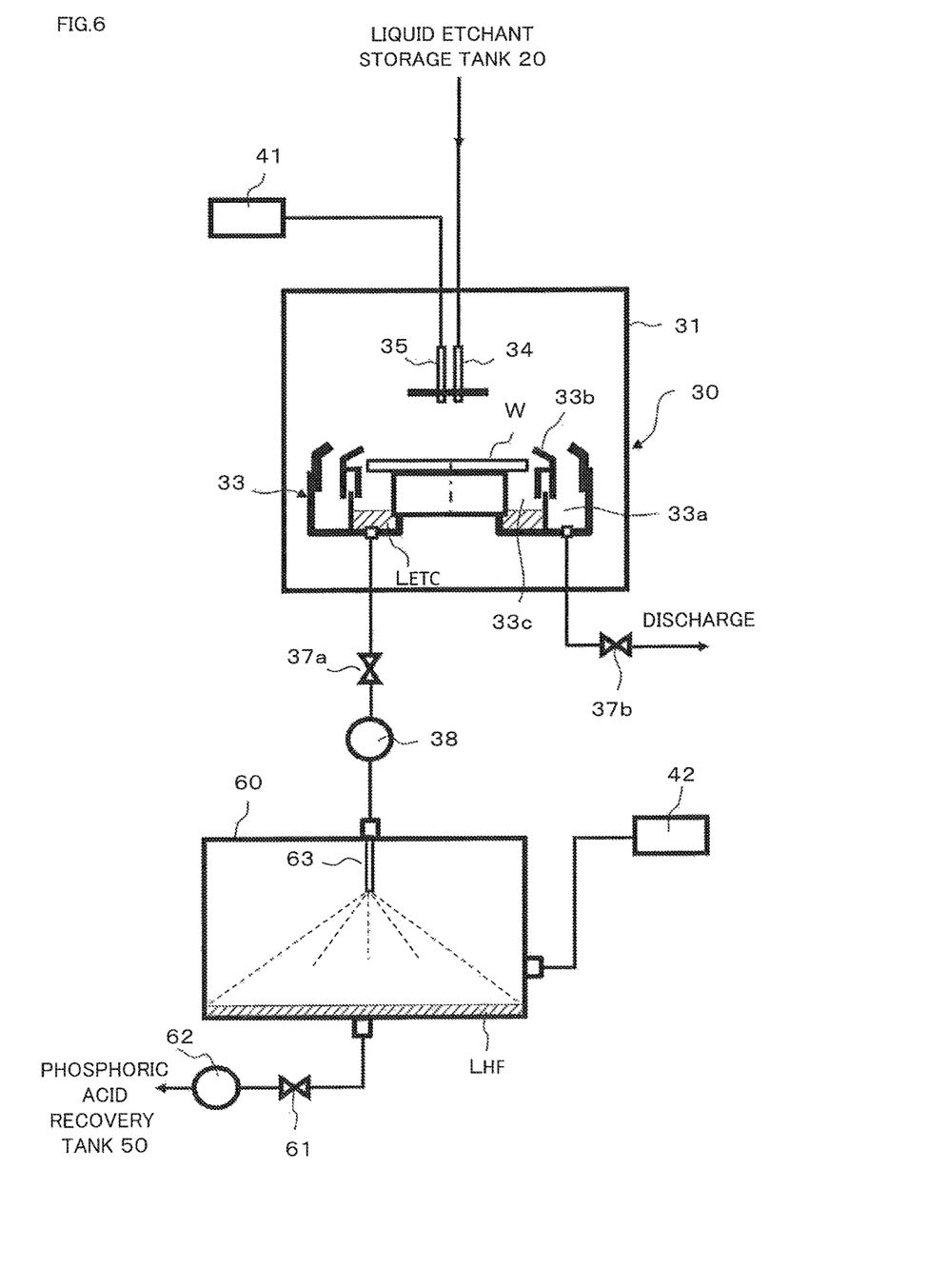
FIG. 6 is a view which shows the configuration of the main parts in a substrate treatment apparatus according to a second embodiment of the present invention.

The main parts of the substrate treatment apparatus according to the second embodiment of the present invention are comprised as shown in FIG. 6. In this substrate treatment apparatus, the phosphoric acid is not regenerated inside the spin treatment unit 30. The phosphoric acid is regenerated outside of the spin treatment unit 30.

In FIG. 6, at the laser part of the spin treatment unit 30, a regenerating treatment tank 60 is provided. The regenerating treatment tank 60 is provided with a used liquid etchant ejection nozzle 63 (used etching feed mechanism). The used liquid etchant ejection nozzle 63 is connected to a path which extends from the inside liquid storing cup 33c of the spin treatment unit 30. In the path, an on-off valve 37a and pump 38 are provided. Further, the regenerating treatment rank 60 and the phosphoric acid recovery tank 50 (see FIG. 1) are connected by a path. In the path, an on-off valve 61 and a pump 62 are provided. This substrate treatment apparatus, in the same way as the above-mentioned example (see FIG. 1), has a hydrofluoric acid feed unit 42 (hydrofluoric acid feed mechanism). The liquid hydrofluoric acid (HF) is supplied, from this hydrofluoric acid feed unit 42 not to the spin treatment unit 30, but the regenerating treatment tank 60.

Note that, since the liquid hydrofluoric acid (HF) is supplied from the hydrofluoric acid feed unit 42 to the regenerating treatment tank 60, the spin treatment unit 30 is not provided, with a hydrofluoric acid ejection nozzle 36 like in the above-mentioned example (see FIG. 1). Further, this substrate treatment apparatus, like the example which is shown in FIG. 1, has a mechanism which generates a liquid etchant (including the liquid etchant producing tank 10, phosphoric acid feed unit 12, the water feed unit 13, and the silica feed unit 14, a mechanism which stores the liquid etchant and sends it to the spin treatment unit 30 (including the liquid etchant storage tank 20), and a mechanism which stores the regenerated liquid phosphoric acid and returns it to the liquid etchant producing tank 10 (including the phosphoric acid recovery tank 50).

In the substrate treatment apparatus according to the second embodiment of the present invention which is explained above, the amount of the liquid hydrofluoric acid LHF (HF) for the amount of liquid etchant for treatment of one semiconductor wafer W is, for example, determined as an amount (suitable quantity) such that when treating the nitride film ($Si_3N_4$) which is formed on the semiconductor wafer W, the equivalent of fluorine (F) becomes 6 times or so the concentration of the Si ingredient, which is dissolved, in the liquid etchant. Such an amount (suitable quantity) of liquid hydrofluoric acid LHF (HF) is stored in advance in the regenerating treatment tank 60. In this state, when the semiconductor wafer W finishes being etched in the spin treatment unit 30, the on-off valve 37a is switched to the open state. Due to operation of the pump 38, the high temperature state (for example, 160° C. or so) used liquid etchant LETC which is stored in the inside liquid storing cup 33c is supplied to the regenerating treatment tank 60. In the regenerating treatment tank 60, the used liquid etchant LETC which is fed from the spin treatment unit 30 is ejected from the used liquid etchant ejection nozzle 63. The high temperature state used liquid etchant is given to the liquid hydrofluoric acid LHF which is stored in the regenerating treatment tank 60 in the atomized state or partially or completely in the vaporized state by that high temperature. In the regenerating treatment tank 60, the used liquid etchant LETC and the liquid hydrofluoric acid LHF are mixed and react under a predetermined high temperature environment, the fluoride ingredient or ammonia ingredient vaporize, and the phosphoric acid ($H_3PO_4$) is regenerated.

Note that, the suitable quantity of liquid hydrofluoric acid (HF) is preferably stored in the regenerating treatment tank 60 in a state with as broad a surface area as possible and in a state as shallow as possible from the viewpoint of the ease of mixing of the used liquid etchant LETC and the liquid, hydrofluoric acid LHF.

At the timing when it is estimated the phosphoric acid has been regenerated due to mixing of the used liquid etchant LETC and the liquid hydrofluoric acid LHF in the regenerating treatment tank 60, the on-off valve 61 is opened and the regenerated liquid phosphoric acid ($H_3PO_4$) in the regenerating treatment tank 60 is supplied to the phosphoric acid recovery tank 50 (see FIG. 1) by operation of the pump 62. Further, in the same way as explained above, it is returned from the phosphoric acid recovery tank 50 to the liquid etchant producing tank 10. The timing of opening of the on-off valve 61 is determined in advance by experiments etc.

According to such a substrate treatment apparatus, in the same way as the first embodiment (see FIG. 1 to FIG. 4), there is no need for a large etching tank like the batch system: it is possible to use the spin treatment unit 30 to etch one semiconductor wafer W at a time. Further, the regenerating treatment tank 60 in which the liquid hydrofluoric acid LHF is stored in advance is supplied with an amount of liquid etchant LETC used for treatment of one semiconductor wafer W which is stored in the inside liquid, storing cup 33c of the spin treatment unit 30 and, in the regenerating treatment tank 60, the used liquid etchant LETC and the liquid hydrofluoric acid LHF react, whereby the phosphoric acid is regenerated, so it is possible to use a regenerating treatment tank 60 of a size of an extent enabling storage of the liquid etchant LETC used for treatment of one semiconductor wafer W and the suitable quantity of liquid hydrofluoric acid LHF for the same so as to make the used liquid etchant LETC and the liquid hydrofluoric acid LHF efficiently react to regenerate the phosphoric acid. In particular, the high temperature used liquid etchant LETC is given in an atomized state or vaporized state to the liquid hydrofluoric acid LHF which is stored in the regenerating treatment tank 60, the reactivity of the used liquid etchant LETC and liquid hydrofluoric acid LHF is high, the fluoride ingredient or ammonia ingredient is immediately easily vaporized due to the high temperature environment which is created by ejection of the high temperature state used, liquid etchant LETC, and, further, the phosphoric acid can be efficiently regenerated.

Note that, in the substrate treatment apparatus according to the second embodiment (see FIG. 6) explained above, the liquid etchant LETC used for treatment of one semiconductor wafer W which is stored in the inside liquid storing cup 33c of the spin treatment unit 30 is given in an atomized state or vaporized state to the suitable quantity of liquid hydrofluoric acid LHF for the used liquid etchant LETC which is stored in the regenerating treatment tank 60, but the present invention is not limited to this. For example, it is also possible to store a suitable quantity of liquid hydrofluoric acid for the amount of liquid etchant LETC used for etching a predetermined number of two or more semiconductor wafers W in advance in the regenerating treatment tank 60 and give the used liquid etchant LETC which is stored in the inside liquid storing cup 33c in the atomized state or vaporized state to the liquid hydrofluoric acid which is stored in the regenerating treatment tank 60 in the process of successive etching treatment of the predetermined number of semiconductor wafers W treated one at a time in the spin treatment unit 30. The predetermined number is determined in a range whereby the amount of used liquid etchant LETC for etching the predetermined number of semiconductor wafers W does not exceed the volume of the inside liquid storing cup 33c.

In this case as well, it is preferable to provide a heater at the inside liquid storing cup 33c from the viewpoint of preventing a drop in temperature of the used liquid etchant LETC which is stored in advance in the inside liquid storing cup 33c.

Further, in the substrate treatment apparatus according to the second embodiment explained above, the liquid hydrofluoric acid LHF (HF) is stored in advance in the regenerating treatment tank 60 and the used liquid etchant LETC which is stored in the inside liquid storing cup 33c of the spin treatment unit 30 is ejected into the regenerating treatment tank 60 in the atomized state or vaporized state, but the present invention is not limited to this. For example, the used liquid etchant LETC which is stored in the inside liquid storing cup 33c of the spin treatment unit 30 may be supplied to and stored at the regenerating treatment tank 60 in advance and, in this state, the liquid hydrofluoric acid LHF may be ejected into the regenerating treatment tank 60 in the atomized state or vaporized state. In this case as well, the liquid etchant LETC used for treatment of one semiconductor wafer is preferably stored in the regenerating treatment tank 60 in a state with as broad a surface area as possible and in a state as shallow as possible from the viewpoint of the ease of mixing of the used liquid etchant LETC and the liquid hydrofluoric acid LHF.

Figure 7:
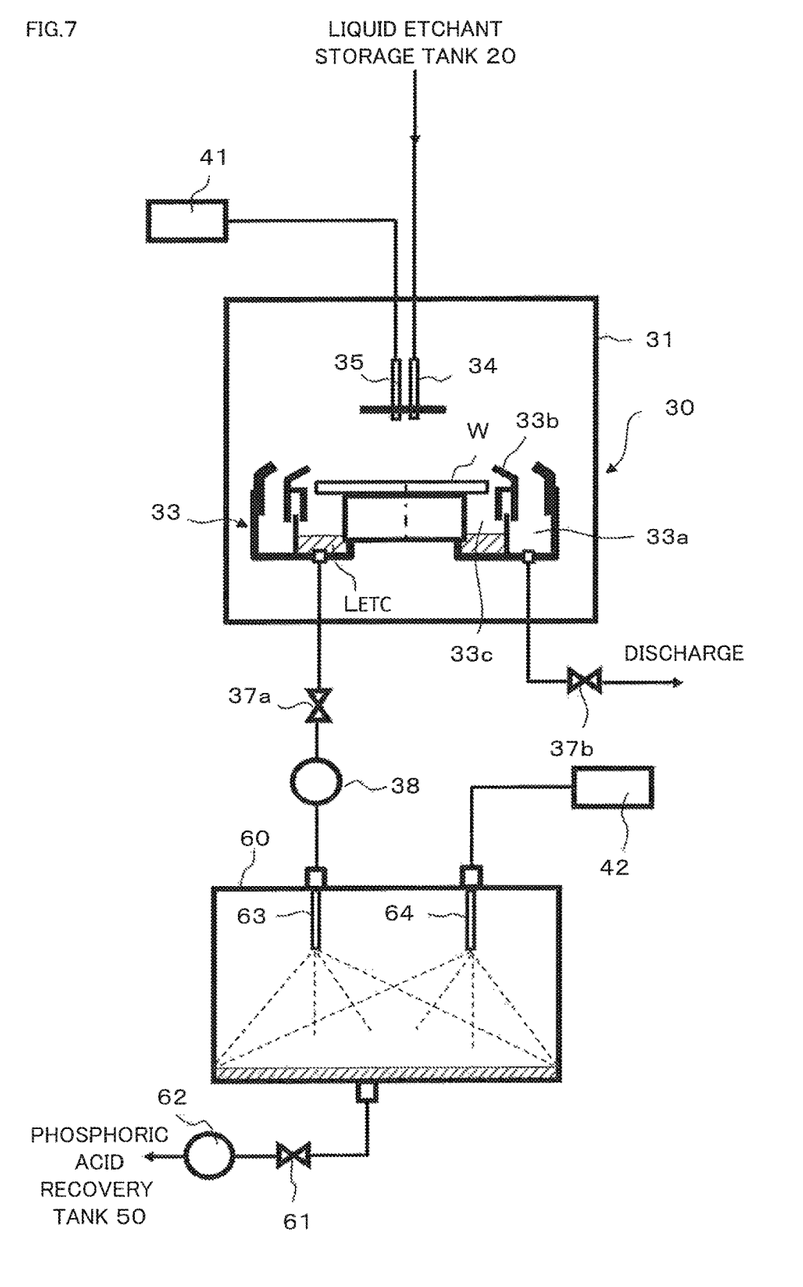
FIG. 7 is a view which shows the configuration of the main parts in a substrate treatment apparatus according to a third embodiment of the present invention.

The main parts of the substrate treatment apparatus according to the third embodiment of the present invention are configured such as shown in FIG. 7. This substrate treatment apparatus also does not regenerate the phosphoric acid in the spin treatment unit 30, but regenerates the phosphoric acid in the regenerating treatment tank 60 which is provided at the outside of the spin treatment unit 30. The substrate treatment apparatus which is provided with the main parts which are shown in FIG. 7 differs from the substrate treatment apparatus according to the second embodiment (see FIG. 6) in the point of the regenerating treatment tank 60 being provided with the hydrofluoric acid ejection nozzle 64 (the hydrofluoric acid feed mechanism).

In such a substrate treatment apparatus, when the semiconductor wafer W finishes being etched in the spin treatment unit 30, the on-off valve 37a is switched to the open state and the pump 38 operates whereby the used liquid, etchant LETC which is stored at the inside liquid storing cup 33c is supplied to the regenerating treatment tank 60. Further, at the same time, the liquid hydrofluoric acid (HF) is fed from the hydrofluoric acid, feed unit 42 to the regenerating treatment tank 60. In the regenerating treatment tank 60, the high temperature state (for example, 160° C. or so) used liquid etchant LETC which is supplied from the spin treatment unit 30 is ejected from the used liquid etchant ejection nozzle 63 in the atomized state or partially or completely in the vaporized state due to the high temperature. Simultaneously, the liquid hydrofluoric acid (HF) which is supplied from the hydrofluoric acid feed unit 42 is ejected from the hydrofluoric acid nozzle 64 in the liquid state, preferably the atomized state. Further, the high temperature state atomized state or vaporized state used liquid etchant LETC and the liquid hydrofluoric acid which is completely or partially vaporized by the high temperature environment which is created by the ejection of that high temperature state used liquid etchant LETC are mixed and reacted in a high temperature environment whereby the fluoride ingredient and ammonia ingredient vaporize and the phosphoric acid ($H_3PO_4$) is regenerated.

Note that, the particle sizes of the atomized state used liquid etchant LETC and liquid hydrofluoric acid (HF) are preferably as small as possible from the viewpoint of easy mixing and high reactivity.

According to such a substrate treatment apparatus, in the same way as the first embodiment (see FIG. 1 to FIG. 4) and second embodiment (see FIG. 6), there is no need, for a large etching tank like with the batch system: it is possible to etch one semiconductor wafer W at a time by the spin treatment unit 30. Further, in the regenerating treatment tank 60, the amount of liquid etchant LETC used for treatment of one semiconductor wafer W which is stored in the inside liquid storing cup 33c of the spin treatment unit 30 and the suitable quantity of liquid hydrofluoric acid LHF for that amount of liquid etchant react in the atomized state or vaporized state whereby the phosphoric acid is regenerated, so in the same way as the second embodiment, it is possible to use a relatively small regenerating treatment rank 60 to make the used liquid etchant LETC and liquid hydrofluoric acid LHF efficiently react to regenerate the phosphoric acid. In particular, in the regenerating treatment tank 60, atomized state or vaporized state used liquid etchant LETC and liquid hydrofluoric acid LHF are mixed in a predetermined high temperature environment, so the reactivity is high, the fluoride ingredient or ammonia ingredient immediately easily vaporizes due to the high temperature environment, and, further, the liquids are made to efficiently react to regenerate the phosphoric acid.

Note that, in the substrate treatment apparatus according to the third embodiment explained above (see FIG. 7), the liquid etchant LETC used for treatment of one semiconductor wafer W which is stored in the inside liquid storing cup 33c of the spin treatment unit 30 and a suitable quantity of liquid hydrofluoric acid LHF for that amount of used liquid etchant LETC were mixed and reacted in the regenerating treatment tank 60 in an atomized state or vaporized state, but the present invention is not limited to this. For example, the used liquid etchant LETC which is stored in the inside liquid storing cup 33c in the process of successive etching treatment of the predetermined number of two or more semiconductor wafers W treated one at a time in the spin treatment unit 30 and the suitable quantity of liquid hydrofluoric acid LHF for the amount of used liquid etchant LETC may be mixed and reacted in the regenerating treatment tank 60 in the atomized state or vaporized state. The predetermined number is determined in a range whereby the amount of liquid etchant LETC used for etching treatment of the predetermined number of semiconductor wafers W does not exceed the volume of the inside liquid storing cap 33c.

In this case as well, it is preferable to provide a heater at the inside liquid storing cup 33c from the viewpoint of preventing a drop in temperature of the used liquid etchant LETC which is stored in advance in the inside liquid storing cup 33c.

Figure 8:
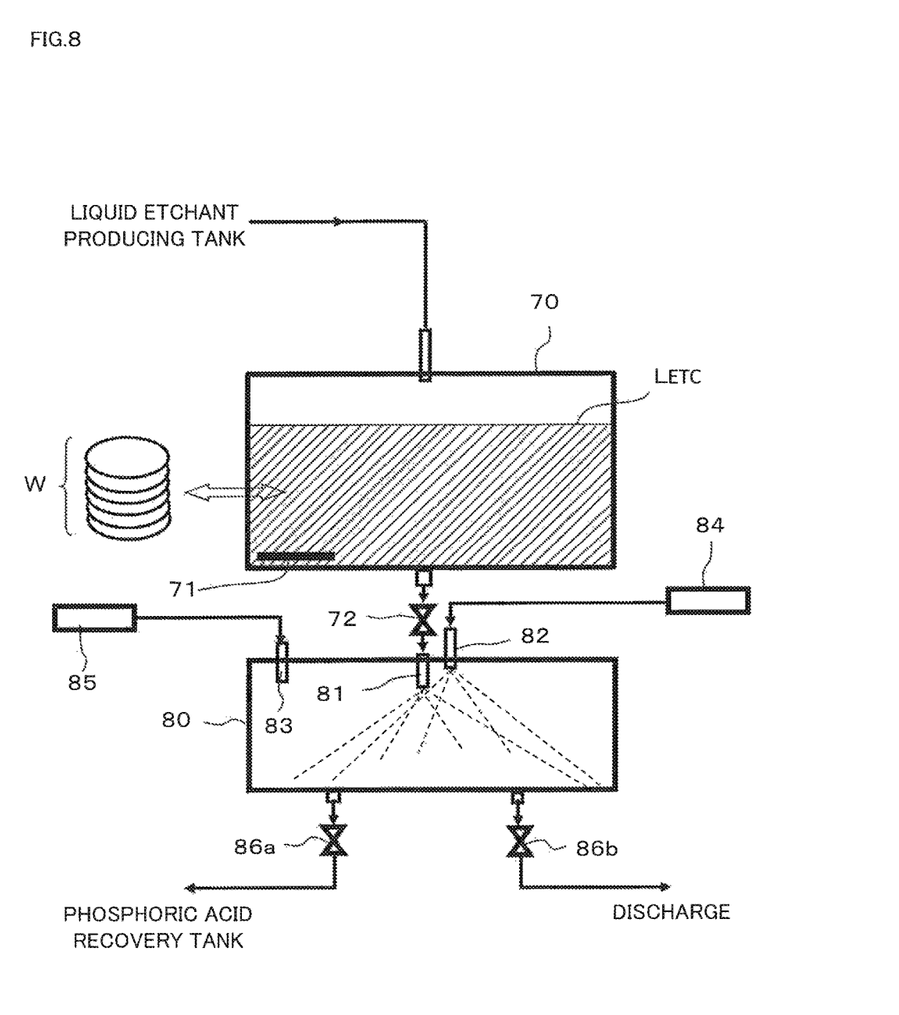
FIG. 8 is a view which shows the configuration of the main parts in a substrate treatment apparatus according to a fourth embodiment of the present invention.

The main parts of the substrate treatment apparatus according to the fourth embodiment of the present invention are configured as shown in FIG. 8. This substrate treatment apparatus, like the above-mentioned substrate treatment apparatuses, is not a single type which treats one semiconductor wafer W at a time, but is a batch type which treats a plurality of semiconductor wafers W at one time.

In FIG. 8, this substrate treatment apparatus has a batch treatment tank 70 (the etching treatment unit) and regenerating treatment tank 80. The batch treatment tank 70 is connected to a liquid etchant producing tank which mixes liquid phosphoric acid ($H_3PO_4$), pure water ($H_2O$), and colloidal silica ($SiO_2$) to generate a liquid etchant (corresponding to the liquid etchant producing tank 10 in FIG. 1). Further, the batch treatment tank 70 is supplied with and stores sufficient liquid etchant for etching a predetermined number of semiconductor wafers W from the liquid etchant producing tank. The batch treatment tank 70 is provided with a heater unit 71 by which the stored liquid etchant is maintained at a predetermined temperature.

The substrate treatment apparatus further has a hydrofluoric acid feed unit 84. The regenerating treatment tank 80 is provided with a used liquid etchant ejection nozzle 81 and a hydrofluoric acid ejection nozzle 82. The used liquid etchant ejection nozzle 81 is connected with the batch treatment tank 70 through an on-off valve 72, while the hydrofluoric acid, ejection nozzle 82 is connected to the hydrofluoric acid feed unit 84. Further, one of the two paths which extend from the bottom part of the regenerating treatment tank 80 is connected through the on-off valve 86a to the phosphoric acid recovery tank (corresponding to the phosphoric acid recovery tank 50 shown in FIG. 1), while is connected through, the on-off valve 86b to a liquid waste tank.

In such a substrate treatment apparatus, in the batch treatment tank 70, a predetermined number of semiconductor wafers W are etched in a batch. In the process of the repeated etching treatment of the semiconductor wafers W which is performed in units of predetermined numbers of wafers, for example, newly produced liquid etchant is supplied from the liquid etchant producing tank to the batch treatment tank 70 at a predetermined timing so that the etching rate of the semiconductor wafer W is maintained in a predetermined range. Further, the on-off valve 72 is opened at a predetermined timing for a predetermined period whereby used liquid etchant LETC is supplied from the batch treatment tank 70 to the regenerating treatment tank 80.

In the regenerating treatment tank 80, the high temperature state (for example, 160° C. or so) used liquid etchant LETC which is supplied from the batch treatment tank 70 at a predetermined timing for a predetermined time is ejected from the used liquid etchant ejection nozzle 81 in the atomized state or partially or completely rendered the vaporized state by the high temperature. In synchronization with this, the liquid hydrofluoric acid LHF which is supplied from the hydrofluoric acid feed unit 84 is ejected from the hydrofluoric acid ejection nozzle 82 in the liquid state, preferably atomized state. Further, these atomized state or vaporized state used liquid etchant LETC and the liquid hydrofluoric acid LHF which is completely or partially rendered the vaporized state by the nigh, temperature environment which is created by ejection of the high temperature state used liquid etchant LETC are mixed and react under that high temperature environment whereby the fluoride ingredient or ammonia ingredient vaporizes and the phosphoric acid ($H_3PO_4$) is regenerated.

The liquid phosphoric acid which is regenerated in the regenerating treatment tank 80 is fed to the phosphoric acid recovery tank and is further returned from the phosphoric acid recovery tank to the etching producing tank.

According to the above-mentioned substrate treatment apparatus, even if using a large amount of liquid etchant for batch etching a predetermined number of semiconductor wafers W in the batch treatment tank 70, in the regenerating treatment tank 80, the used liquid etchant LETC and the liquid hydrofluoric acid LHF are mixed and react in an atomized state or vaporized state, so it is possible to make the used liquid etchant and liquid hydrofluoric acid efficiently react to regenerate the phosphoric acid without using a facility for scoring and reacting the entire amount of used liquid etchant LETC after etching a plurality of semiconductor wafers W with a liquid hydrofluoric acid LHF.

Note that, in the second embodiment (see FIG. 6), third embodiment (see FIG. 7), and fourth embodiment (see FIG. 8), the used liquid etchant ejection nozzles 63 and 81 eject the used liquid etchant LETC in an atomized state or vaporized state, but the used liquid etchant LETC may also be ejected as is in the liquid state without being rendered the atomized state or vaporized state.

REFERENCE SIGNS LIST

10 liquid etchant producing tank
11 heater unit
12 phosphoric acid feed unit
13 water feed unit
14 silica feed unit
15 pump
16 selector valve
17 concentration detector
20 liquid etchant storage tank
21 heater unit
22*a*, 22*b* on-off valve
23 pump
24 flowmeter
25 selector valve
26 cooler
30 Spin treatment unit
31 treatment chamber
32 substrate spin mechanism
33 liquid storing cup
34 liquid etchant ejection nozzle
35 liquid rinse ejection nozzle
36 hydrofluoric acid ejection nozzle
37*a*, 37*b* on-off valve
38 pump
41 liquid rinse feed unit
42 hydrofluoric acid feed unit
50 phosphoric acid recovery tank
51 heater unit
52 pump
60 regenerating treatment tank
61 on-off valve
62 pump
63 used liquid etchant ejection nozzle
64 hydrofluoric acid ejection nozzle
70 batch treatment tank
71 heater unit
80 regenerating treatment tank
81 used liquid etchant ejection nozzle
82 hydrofluoric acid ejection nozzle
84 hydrofluoric acid feed unit
86*a*, 86*b* on-off valve

What is claimed is:

1. A substrate treatment apparatus which treats a silicon substrate on which a nitride film is formed using liquid etchant which contains phosphoric acid, said substrate treatment apparatus comprising:
   an etching treatment section which is configured to provide a suitable quantity of liquid etchant to each substrate which is fed one at a time so as to etch said substrate and remove the nitride film;
   wherein said etching treatment section comprises:
   a substrate spinner which is configured to make each substrate fed one at a time spin,
   a liquid etchant feeder which is configured to provide a suitable quantity of liquid etchant to a surface of said substrate which is spun by said substrate spinner,
   a hydrofluoric acid feeder fluidly connected to a hydrofluoric acid supply, and
   a liquid storing section which is configured to store used liquid etchant which is provided to the surface of said spinning substrate and is splattered from the surface of said substrate,
   wherein the hydrofluoric acid feeder is configured to provide a suitable amount of hydrofluoric acid under a predetermined temperature environment from the hydrofluoric acid supply to the liquid storing section of the etching treatment section to mix and react the used liquid etchant and the suitable amount of hydrofluoric acid to regenerate phosphoric acid inside the etching treatment section;
   and
   said substrate treatment apparatus further comprising:
   a phosphoric acid recovery section which is configured to return the phosphoric acid regenerated inside the etching treatment section to the liquid etchant to be used at said etching treatment section.

2. The substrate treatment apparatus according to claim 1, wherein the hydrofluoric acid feeder is configured to provide the suitable quantity of hydrofluoric acid for the amount of the liquid etchant used for treatment of a single substrate to the liquid storing section to regenerate the phosphoric acid.

3. The substrate treatment apparatus according to claim 1, wherein the hydrofluoric acid feeder includes a nozzle configured to render the liquid hydrofluoric acid in an atomized state or vaporized state.

4. The substrate treatment apparatus according to claim 1, further comprising a controller which is configured to control the etching treatment section so that the hydrofluoric acid feeder provides the hydrofluoric acid to the liquid storing section in a state where the used liquid etchant is stored in the liquid storing section.

5. A substrate treatment apparatus which treats a silicon substrate on which a nitride film is formed using liquid etchant which contains phosphoric acid, said substrate treatment apparatus comprising:
   an etching treatment section which is configured to provide a suitable quantity of liquid etchant to each substrate which is fed one at a time so as to etch said substrate and remove the nitride film;
   wherein said etching treatment section includes:
   a substrate spinner which is configured to make each substrate which is fed one at a time spin, a liquid etchant feeder which is configured to provide a suitable quantity of liquid etchant to a surface of said substrate which is spun by said substrate spinner, a hydrofluoric acid feeder fluidly connected to a hydrofluoric acid supply, and a liquid storing section which is configured to store used liquid etchant which is provided to the surface of said spinning substrate and is splattered from the surface of said substrate, and said substrate treatment apparatus further comprising:

a controller which is configured to control the etching treatment section so that hydrofluoric acid feeder provides a suitable amount of hydrofluoric acid under a predetermined temperature environment from the hydrofluoric acid supply to the liquid storing section and the liquid etchant feeder provides a suitable quantity of liquid etchant to the surface of each of a predetermined number of substrates treated one at a time in a state where the liquid storing section stores the suitable amount of hydrofluoric acid for the quantity of liquid etchant used for treatment of the predetermined number of substrates to mix and react the used liquid etchant and the suitable amount of hydrofluoric acid to regenerate phosphoric acid at the liquid storing section; and a phosphoric acid recovery section which is configured to return regenerated phosphoric acid to the liquid etchant to be used at said etching treatment section.

6. The substrate treatment apparatus according to claim 5, the controller controls the etching treatment section so that the liquid etchant feeder provides a suitable quantity of liquid etchant to the surface of a single substrate a state where the liquid storing section stores the suitable amount of hydrofluoric acid for the quantity of liquid etchant used for treatment of the single substrate.

* * * * *